US008321766B2

(12) United States Patent
Terui et al.

(10) Patent No.: US 8,321,766 B2
(45) Date of Patent: Nov. 27, 2012

(54) IP-DATA TRANSMITTING APPARATUS AND IP-DATA TRANSMITTING METHOD

(75) Inventors: Yuichi Terui, Kawasaki (JP); Kaname Yoshida, Kawasaki (JP); Takehiko Fujiyama, Kawasaki (JP); Seiji Matsuo, Kawasaki (JP); Hiroaki Kameyama, Kawasaki (JP); Yuichi Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 982 days.

(21) Appl. No.: 11/486,146

(22) Filed: Jul. 14, 2006

(65) Prior Publication Data

US 2007/0220404 A1 Sep. 20, 2007

(30) Foreign Application Priority Data

Mar. 20, 2006 (JP) .................................. 2006-077000

(51) Int. Cl.
*H03M 13/35* (2006.01)
(52) U.S. Cl. ....................................... 714/774; 714/776
(58) Field of Classification Search .................. 714/774, 714/776
See application file for complete search history.

(56) References Cited

U.S. PATENT DOCUMENTS

| | | | | |
|---|---|---|---|---|
| 5,617,541 A * | 4/1997 | Albanese et al. | ............. | 709/207 |
| 6,307,847 B1 * | 10/2001 | Wood, Jr. | ....................... | 370/329 |
| 6,697,352 B1 * | 2/2004 | Ludwig et al. | ................. | 370/349 |
| 6,856,263 B2 * | 2/2005 | Shokrollahi et al. | ............. | 341/50 |
| 7,020,823 B2 * | 3/2006 | Bushmitch et al. | ............. | 714/752 |
| 7,139,966 B2 * | 11/2006 | Litwin et al. | ................... | 714/776 |
| 7,233,264 B2 * | 6/2007 | Luby | ............................... | 341/50 |
| 7,304,990 B2 * | 12/2007 | Rajwan | ......................... | 370/389 |
| 2002/0053049 A1 | 5/2002 | Shiomoto et al. | | |
| 2002/0164024 A1 | 11/2002 | Arakawa et al. | | |
| 2003/0005386 A1 | 1/2003 | Bhatt et al. | | |
| 2005/0195755 A1 | 9/2005 | Senta et al. | | |
| 2007/0113032 A1 | 5/2007 | Kameyama et al. | | |
| 2007/0133691 A1 | 6/2007 | Kozat | | |

FOREIGN PATENT DOCUMENTS

| | | |
|---|---|---|
| JP | 06-125534 A | 5/1994 |
| JP | 11-196072 | 7/1999 |
| JP | 2000-115085 | 4/2000 |
| JP | 2002-204220 A | 7/2002 |
| JP | 2003-092564 A | 3/2003 |
| JP | 2007-140829 A | 6/2007 |
| WO | WO-2004/030273 | 4/2004 |
| WO | WO-2007/064745 | 6/2007 |

OTHER PUBLICATIONS

Kim et al, "Error-Resilient Image and Video Transmission Over the Internet Using Unequal Error Protection", IEEE Transactions on Image Processing, vol. 12, No. 2, Feb. 2003, pp. 121-131.*

(Continued)

*Primary Examiner* — Stephen M Baker
(74) *Attorney, Agent, or Firm* — Fujitsu Patent Center

(57) ABSTRACT

An IP-data transmitting apparatus performs an error correction coding by classifying data into a layer indicative of the priority order of the data based on importance and vulnerability of information included in the data, and combining a plurality of data components into combination patterns. The number of the combination patterns is specified with respect to each layer with predetermined priority order.

11 Claims, 7 Drawing Sheets

OTHER PUBLICATIONS

Feng, et al., "Packet-loss resilient coding scheme with only XOR operations", IEE Proceedings—Communications, vol. 151, Issue 4, Aug. 2004, pp. 322-326.*

Japanese Office Action, English-Language Translation, mailed Oct. 19, 2010 in corresponding Japanese Application No. 2006-077000.

Rahnavard et al., "Finite-Length Unequal Error Protection Rateless Codes: Design and Analysis", Global Telecommunications Conference, 2005, GLOBECOM '05. IEEE, Dec. 2005, vol. 3, p. 1353-1357.

"Japanese Office Action (Decision of patent grant)", mailed by JPO and corresponding to Japanese application No. 2006-077000 on Feb. 22, 2011, with English translation.

* cited by examiner

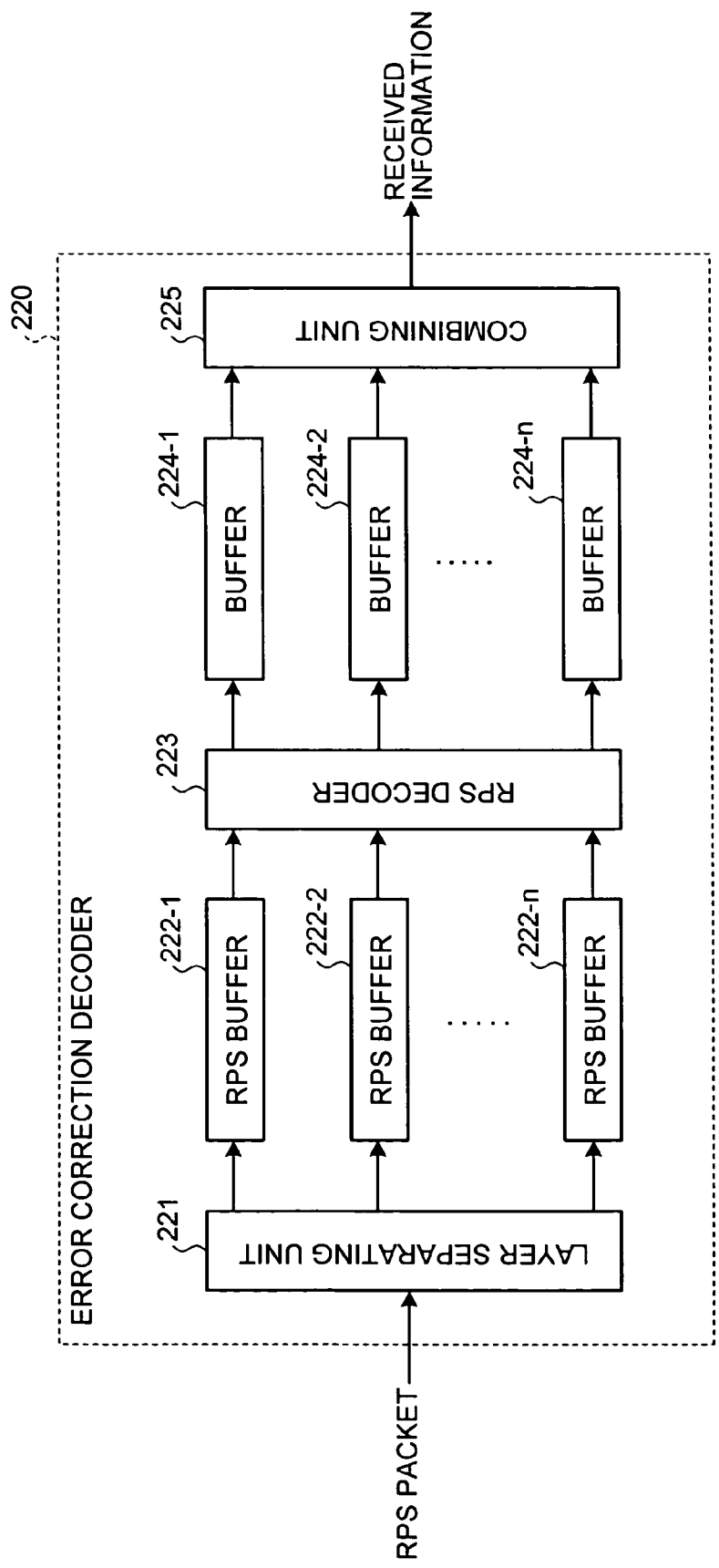

FIG.6A

| LAYER | INFORMATION TYPE | CONTENTS OF DATA | REDUNDANCY |
|---|---|---|---|
| FIRST PRIORITY | CONTROL INFORMATION | PROGRAM SPECIFICATION INFORMATION | 2.0 |
| SECOND PRIORITY | IMAGE INFORMATION | I FRAME, SOUND | 1.8 |
| THIRD PRIORITY | | P FRAME, B FRAME | 1.5 |
| FOURTH PRIORITY | ASSOCIATED INFORMATION | DATA BROADCASTING (EXCEPT DATA CAROUSEL) | 1.2 |
| FIFTH PRIORITY | | DATA BROADCASTING (DATA CAROUSEL) | 1.0 |

FIG.6B

| LAYER | INFORMATION TYPE | CONTENTS OF DATA | REDUNDANCY |
|---|---|---|---|
| FIRST PRIORITY | IMAGE INFORMATION | I FRAME, SOUND | 2.0 |
| SECOND PRIORITY | | SOUND | 1.8 |
| THIRD PRIORITY | | P FRAME, B FRAME | 1.5 |
| FOURTH PRIORITY | ASSOCIATED INFORMATION | REAL-TIME INFORMAITON | 1.2 |
| FIFTH PRIORITY | | NON-REAL-TIME INFORMAITON | 1.0 |

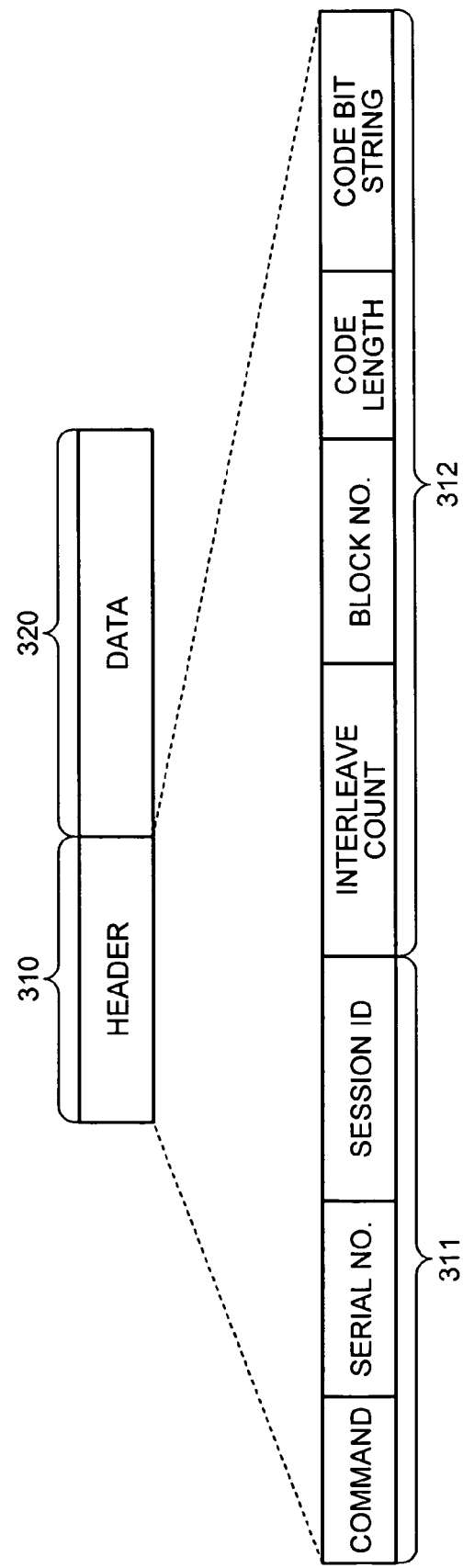

IP-DATA TRANSMITTING APPARATUS AND IP-DATA TRANSMITTING METHOD

BACKGROUND OF THE INVENTION

1. Field of the Invention

The present invention generally relates to a technology for transmitting data using an internet protocol (IP), and more specifically relates to error correction coding of the data.

2. Description of the Related Art

Images and sounds can be transmitted using an internet protocol (IP). When the images and sounds are transmitted through the Internet, because real-time reproduction is often required, the User Datagram Protocol (UDP), which does not involve retransmitting control, is often employed as the standard protocol.

For example, to certain areas like deep valleys, where the digital spectrum does not reach properly, television (TV) programs can be streamed in the form of the UDP packets via optical networks. In other words, the broadcasting and the telecommunication are so closely related that they are almost integrated.

One of the most important techniques employed in both the broadcasting and the telecommunication is the error correction technique. With the error correction technique, a transmitter performs an error correction coding on a data, and a receiver decodes the error-correction coded data, whereby an error occurred during data transmission is corrected. During transmission of data such as images and sounds, modulation methods and error-correction coding method can be changed as disclosed in Japanese Patent Laid-Open Publication No. 2000-115085.

When a TV program is streamed via the Internet, a limited bandwidth is shared with the existing internet communication line and the like, and sufficient bandwidth can hardly be allocated to the broadcasting. It becomes therefore important for the broadcasting to take most advantage of the limited bandwidth to correctly transmit highly prioritized data because the broadcasting needs to be provided in real time.

With the general error correction technique, however, while errors occurred in a small range of the data can be corrected, errors deriving from loss of a whole packet or the like cannot be corrected. The error-correction coding method generally used for broadcasting is suitable for correcting bit errors, which cannot correct errors sufficiently when packets of data are transmitted through the Internet.

SUMMARY OF THE INVENTION

It is an object of the present invention to at least partially solve the problems in the conventional technology.

According to an aspect of the present invention, an internet protocol data (IP-data) transmitting apparatus that transmits data using an internet protocol (IP) includes a classifying unit that classifies data into a layer indicative of priority order of the data based on importance and vulnerability of information included in the data; an error correction coding unit that performs an error correction coding by combining a plurality of data components into combination patterns, the number of the combination patterns being specified with respect to each layer classified by the classifying unit, thereby producing error-correction coded data; and a transmitting unit that transmits packets produced from the error correction coded data.

According to another aspect of the present invention, a method for transmitting data using an internet protocol (IP) includes classifying a layer indicative of priority order of the data based on importance and vulnerability of information included in the data; performing an error correction coding by combining a plurality of data components in different numbers of combination patterns specified with respect to each layer, thereby producing error-correction coded data; and transmitting packets resulting from the error correction coded data.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a detailed block diagram of an error correction decoder shown in FIG. 4;

FIGS. 6A and 6B are examples of the layer of data; and

FIG. 7 is an example of the structure of a transmitted RSP packet.

DETAILED DESCRIPTION OF THE PREFERRED EMBODIMENTS

Exemplary embodiments of the present invention are explained below in detail referring to the accompanying drawings. The present invention is not limited to the embodiments explained below.

While the embodiments are explained assuming a case of sending multimedia data such as images and sounds acquired by a camera and the like, a technology of the present invention can be applied to a case of relaying multimedia data received from other sources, for example, via a network.

Figure 1:
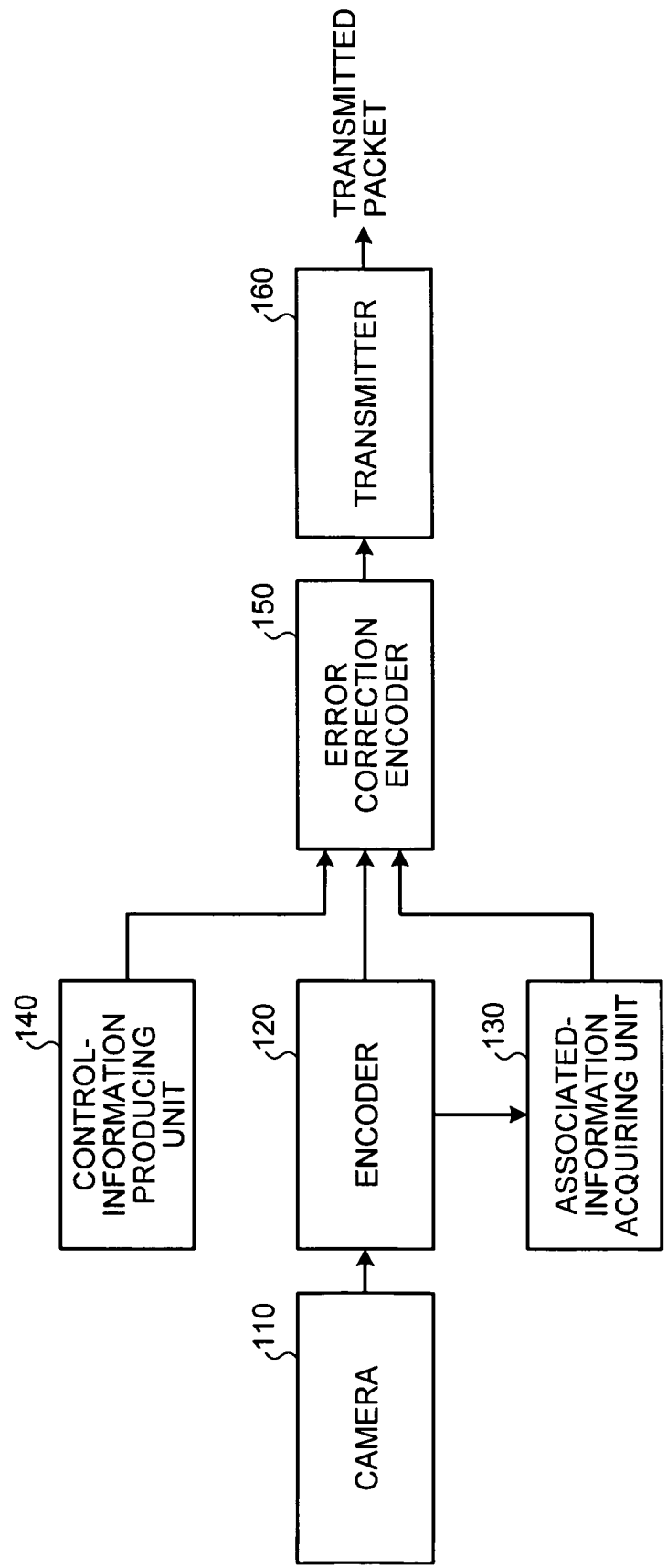
FIG. 1 is a block diagram of a relevant structure of an IP-data transmitting apparatus according to an embodiment of the present invention.

FIG. 1 is a block diagram of an IP-data transmitting apparatus according to an embodiment of the present invention. The IP-data transmitting apparatus includes a camera 110, an encoder 120, an associated-information acquiring unit 130, a control-information producing unit 140, an error correction encoder 150, and a transmitter 160.

The camera 110 acquires an image of an object and outputs the image to the encoder 120. The camera 110 can include a microphone that pick-up surrounding sound. The encoder 120 encodes the image, and outputs the encoded image information to the associated-information acquiring unit 130 and the error correction encoder 150.

The associated-information acquiring unit 130 acquires associated information in association with the image information. For example, if the camera 110 is used for monitoring, the associated-information acquiring unit 130 acquires the associated information such as the time of taking the image and the direction in which the image was taken. If the object of the image is a human, the associated-information acquiring unit 130 acquires the associated information in association with clothes and accessories that the object wears. In other cases, the associated information can be the name or the personality profile of the object, subtitles, and the like. Distribution of such associated information along with the image information improves the customer service in the broadcasting industry. The associated-information acquiring unit 130 acquires such associated information from input by an operator or from a sensor not shown in the drawings. The associated-information acquiring unit 130 can also acquire the associated information by, for example, analyzing the image information and searching database (not shown) based on the result of the analysis.

The control-information producing unit 140 produces control information required for reproduction of the image on the receiving side, and outputs the control information to the error correction encoder 150.

The error correction encoder 150 determines a layer for each of the control information, image information, and associated information in accordance with the importance and the vulnerability thereof, and performs error correction coding on the information in more prioritized layer with more resistance to errors. In the error correction coding, the error correction encoder 150 performs a random parity stream (RPS) coding that uses an exclusive OR (XOR) of data in an identical layer, and outputs the resulting RPS packet to the transmitter 160. The configuration of the error correction encoder 150 and the RPS coding will be detailed later.

The transmitter 160 adds a predetermined header such as a serial number to the RPS packet output from the error correction encoder 150, and transmits the resulting packet.

Figure 2:
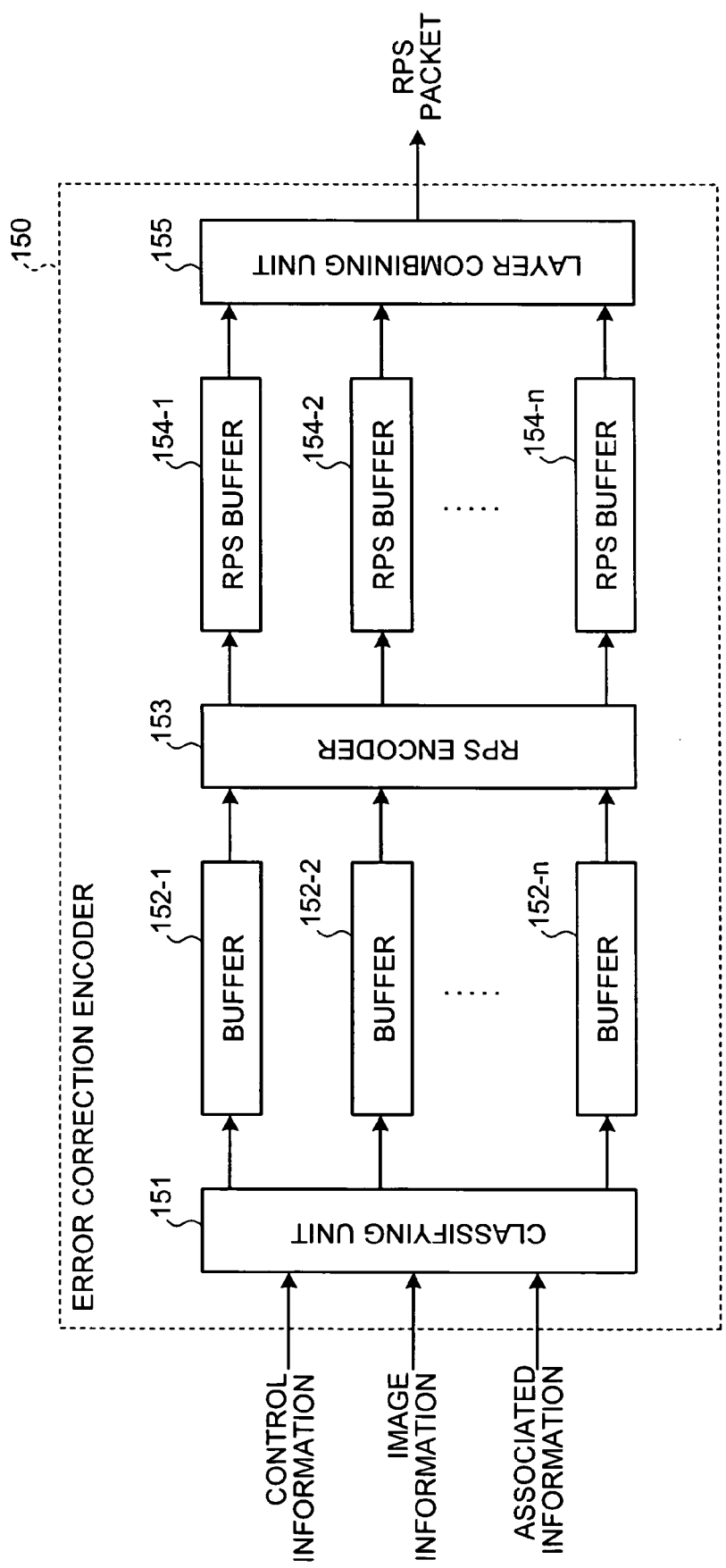
FIG. 2 is a detailed block diagram of an error correction encoder shown in FIG. 1.

FIG. 2 is a block diagram of the error correction encoder 150. The error correction encoder 150 includes a classifying unit 151, buffers 152-1 to 152-$n$, an RPS encoder 153, RPS buffers 154-1 to 154-$n$, and a layer combining unit 155.

The classifying unit 151 allocates each of the control information, the image information, and the associated information to one of n layers, where n is a positive integer more than one, based on the importance and the vulnerability of the information. More specifically, the classifying unit 151 allocates important information such as control information and vulnerable information the error of which would significantly affect displaying the image to a layer with higher priority. On the contrary, the classifying unit 151 allocates less important information such as non-real-time information and error-resistant information transmitted by the carousel method to a layer with lower priority. The non-real-time information does not need to be reproduced in real time. The carousel method is to repeat transmitting the identical information. The classifying unit 151 allocates the associated information to a layer lower than that of the image information. The classifying unit 151 then outputs the information in the m-th layer (m is an integer equal to or less than n) to a corresponding buffer 152-$m$ as the m-th-priority data.

Each of the buffers 152-1 to 152-$n$ temporarily stores therein the corresponding one of the data with the first to n-th priority and outputs the data to the RPS encoder 153.

Figure 3:
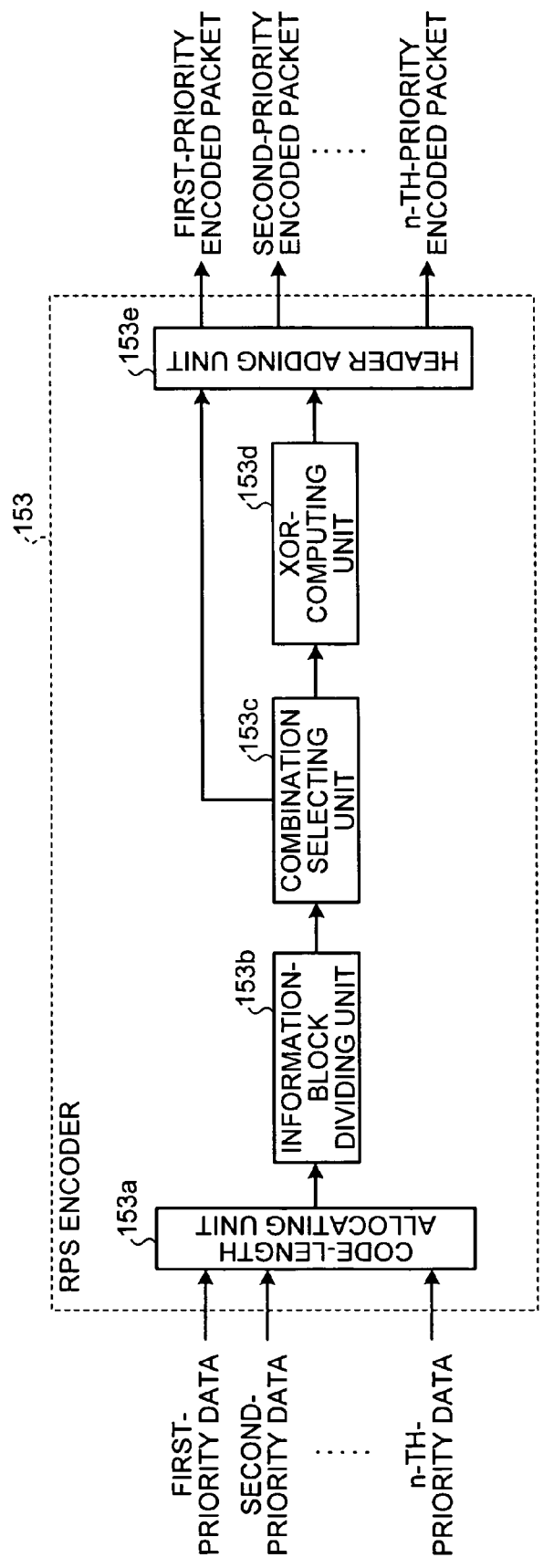
FIG. 3 is a detailed block diagram of a random parity streaming (RSP) encoder shown in FIG. 2.

The RPS encoder 153 performs an RPS coding on the data, and outputs each of the encoded packets with the first to n-th priority in each layer to the corresponding one of the RPS buffers 154-1 to 154-$n$. FIG. 3 is a block diagram of the RPS encoder 153. The RPS encoder 153 includes a code-length assigning unit 153$a$, an information-block dividing unit 153$b$, a combination selecting unit 153$c$, an XOR computing unit 153$d$, and a header adding unit 153$e$.

The code-length assigning unit 153$a$ allocates a certain code length to each of the data based on the layer, and divides each data into data blocks with a certain size corresponding to the code length. More specifically, the code-length assigning unit 153$a$ allocates the longer code length to more prioritized data, and the shorter code to less prioritized data. The code length indicates a range of data that can be combined at the time of encoding, and more specifically indicates the number of information blocks in a single data block. The information block is regarded as the unit of the data used the data is combined. Accordingly, larger code length allows combination patterns of more information blocks, and data in a single information block can be dispersed into more packets for error correction coding. This improves resistance to errors in the unit of the packet.

The information-block dividing unit 153$b$ divides each of the data into a predetermined size of the information block, and outputs a plurality of the information blocks to the combination selecting unit 153$c$. Because the code-length assigning unit 153$a$ allocates the code length corresponding to the layer, data blocks of the data with different priorities are divided into different numbers of the information blocks.

The combination selecting unit 153$c$ selects combination patterns to be used for error correction coding from among a plurality of the combination patterns the information blocks that belong to the identical data block, and reports the selected combination pattern to the XOR computing unit 153$d$ and the header adding unit 153$e$. At this time, the combination selecting unit 153$c$ determines the number of combination patterns to be selected based on the layer, namely the priority order of the data. More specifically, the value of redundancy is defined for each layer, which indicates the ratio of the code length, namely the number of the information block, to the number of selected combination patterns. The combination selecting unit 153$c$ determines the number of combination patterns that satisfies the redundancy. For example, when the code length is four and the redundancy assigned to the data is 1.5, the combination selecting unit 153$c$ selects six (1.5×4) patterns of combinations from all possible combinations of any two to four information blocks. It should be noted that the larger redundancy is defined for the higher layer, and the smaller redundancy is defined for the lower layer. With a larger redundancy, more combination patterns are selected, and each information block is used in more combinations, resulting in higher resistance to errors. The redundancy value is no less than one in any layer, and so the combination selecting unit 153$c$ selects at least the number of combination patterns equal to the code length.

The XOR computing unit 153$d$ computes an XOR of the information blocks in each of the combinations reported from the combination selecting unit 153$c$, and outputs the bit strings of the computed result to the header adding unit 153$e$. The bit strings indicates the data of the information blocks in each combination.

The header adding unit 153$e$ adds a header indicative of the combination and the layer of the data reported from the combination selecting unit 153$c$ to each bit string to produce a encoded packet with the corresponding priority order.

Returning to the explanation of FIG. 2, each of the RPS buffers 154-1 to 154-$n$ temporarily stores therein the encoded packet with the corresponding priority order, and outputs the encoded packet to the layer combining unit 155.

The layer combining unit 155 combines the encoded packets and outputs the resulting RPS packet.

Figure 4:
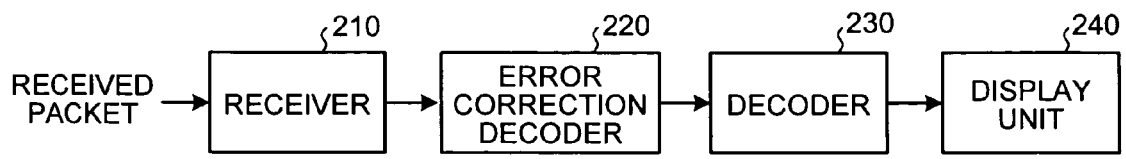
FIG. 4 is a block diagram of a relevant structure of an IP-data receiving apparatus used with the IP-data transmitting apparatus.

FIG. 4 is a block diagram of an IP-data receiving apparatus used with the IP-data transmitting apparatus shown in FIG. 1. The IP-data receiving apparatus includes a receiver 210, an error correction decoder 220, a decoder 230, and a display unit 240.

The receiver 210 receives packets from the IP-data transmitting apparatus, performs predetermined processes such as removal of unnecessary part of the header, and outputs the resulting RPS packet to the error correction decoder 220.

The error correction decoder 220 identifies the layer of the data based on the remaining header of the RPS packet, performs an error correction decoding in accordance with the layer, and outputs the correct information to the decoder 230. The configuration of the error correction decoder 220 will be detailed later.

The decoder 230 decodes the information received from the error correction decoder 220, and outputs the resulting image data to the display unit 240. The display unit 240 displays the image data thereon.

FIG. 5 is a block diagram of the error correction decoder 220. The error correction decoder 220 includes a layer separating unit 221, RPS buffers 222-1 to 222-*n*, an RPS decoder 223, buffers 224-1 to 224-*n*, and a combining unit 225.

The layer separating unit 221 refers to the header of the RPS packet, and separates the RPS packet into encoded packets with the priority order corresponding to each layer. More specifically, the layer separating unit 221 refers to the field of the code length included in the header of the RPS packet, and separates the RPS packet into the encoded packets with the priority order corresponding to the code length.

Each of the RPS buffers 222-1 to 222-*n* temporarily stores therein the encoded packet with the corresponding priority order, and outputs the encoded packet to the RPS decoder 223.

The RPS decoder 223 decodes the encoded packets, and outputs the data acquired from each layer to the corresponding one of the buffers 224-1 to 224-*n*. More specifically, the RPS decoder 223 extracts the bit string indicative of the XOR of the information blocks from each of the encoded packets, and acquires the original information block from the XOR using the combination information included in the encoded packet as the header. The RPS decoder then couples the number of information blocks corresponding to the layer to reproduce the data with each priority order.

Each of the buffers 224-1 to 224-*n* temporarily stores therein the corresponding one of the data with the first to n-th priority reproduced by the RPS decoder 223, and outputs the data to the combining unit 225.

The combining unit 225 combines the data and outputs the information. More specifically, the combining unit 225 combines the associated information over the image information reproduced from the data, and outputs the combined information to the decoder 230 as the received information.

An example of transmitting multimedia data using the IP-data transmitting apparatus and the IP-data receiving apparatus is described below.

The camera 110 acquires images and sounds, and the encoder 120 encodes the images and the sounds. The encoded image information is output to the classifying unit 151 in the error correction encoder 150. At the same time, the control-information producing unit 140 produces control information required for reproduction of the image, and outputs the control information to the classifying unit 151 in the error correction encoder 150. The associated-information acquiring unit 130 acquires associated information in association with the image information, and outputs the associated information to the classifying unit 151 in the error correction encoder 150.

The classifying unit 151 then determines a layer for each of the control information, the image information, and the associated information based on the importance and the vulnerability. FIGS. 6A and 6B are examples of the layer of the data. The control information required for the reproduction of the image is allocated to the first-priority layer. The image information that needs to be reproduced in real time during the streaming is allocated to the second-priority layer and the third-priority layer. Among the image information, intra frame (I frame) information is prioritized over prediction picture frame (P frame) information and bidirectional frame (B frame) information. The I frame provides a basis of the image, and each of the P frame and B frame includes difference from the I frame.

The associated information in association with the image information is allocated to the fourth-priority layer that follows the layers of the image information. The associated information is associated with the object of the image. The associated information is prioritized over such information that is not associated with the image because the associated information must be reproduced in real time in synchronization with the image information. On the other hand, the associated information is less prioritized than the image information itself. Even if the control information is not included, the image information is prioritized over the associated information.

Such information independent of the image as the weather forecast is allocated to the fifth-priority layer with the lowest priority. The weather forecast information is often transmitted by the carousel method because it is not related to the image and it does not always have to be reproduced in real time. The information transmitted by the carousel method is highly resistant to the errors without error correction coding because the identical data is transmitted repeatedly. This means the information does not require high priority in view of the vulnerability.

Each of the layers determined by the classifying unit 151 is associated with the code length for RPS coding and the redundancy. The values of the code length and the redundancy are larger in a layer with higher priority. This means that the data in more prioritized layer can be combined with more data, and more combinations of the data are actually transmitted.

Based on the layer specified by the classifying unit 151, each of the buffers 151-1 to 151-*n* stores therein the corresponding one of the data with the first to n-th priority. The stored data is output to the code-length assigning unit 153*a* in the RPS encoder 153, and assigned with a code length corresponding to the layer. The data is then divided into data blocks with the size corresponding to the allocated code length, and output to the information-block dividing unit 153*b*. Because the code length is larger for the data in the higher layer, and the code length is equal to the number of the information block with a predetermined size, the data block in the higher layer is larger in size.

The information-block dividing unit 153*b* divides the data block into the predetermined size (for example, one byte) of information block and outputs the information blocks to the combination selecting unit 153*c*. The data block is divided based on the code length so that the number of the information block is equal to the code length. The larger the code length is, and the larger the number of the information block divided from the same data block is, information blocks corresponding to the farther data can be combined. This improves resistance to errors in a broad area such as an entire packet.

When the information blocks are output to the combination selecting unit 153*c*, the combination selecting unit 153*c* selects the number of combination patterns that is defined by the redundancy of the layer from among more than one combination pattern. As shown in FIG. 6, each layer is associated with each value of the redundancy, and the number of combinations of the information blocks selected the by the combination selecting unit 153*c* is the multiplication of the code length by the redundancy based on the layer of the data. This means that, with a larger redundancy, more combinations are selected by the combination selecting unit 153*c*, and a single information block is included in more combinations. As a result, the data with larger redundancy is more resistant to errors.

The selected combination patterns are reported to the XOR computing unit 153d and the header adding unit 153e, and the XOR computing unit 153d computes an XOR of the information blocks in each of the combinations. The XOR is output to the header adding unit 153e, and the header adding unit 153e adds a header including information on the combination, the code length, and the like. A bit string with the digits equal to the code length is used as the combination information so that the combination of the information blocks is indicated by the bit string in which the bit corresponding to the combined information block is one. In other words, at the time of decoding, the information block corresponding to the bit is acquired by performing the operation so that only one of the bits in the bit string in the combination information indicates one. The operation is a matrix operation of matrix including a plurality of pieces of combination information.

Each of the encoded packets with the header is stored in the corresponding one of the RPS buffers 154-1 to 154-n, and combined by the layer combining unit 155. The transmitter 160 adds a header such as a serial number to the RPS packet resulting from combining encoded packets in different layers, and transmits the RPS packet to the IP-data receiving apparatus.

FIG. 7 is an example of the structure of the transmitted RPS packet. The RPS packet includes a header portion 310 and a data portion 320. The header portion 310 includes a transmission header 311 added by the transmitter 160 and an RPS header 312 added by the header adding unit 153e in the RPS encoder 153. The field of the code length in the RPS header 312 stores therein the code length corresponding to the layer of the data, which enables the IP-data receiving apparatus to identify the layer of each data combined in the data portion 320 by comparing with the code length. The field of the code bit string in the RPS header 312 stores therein the combination information. The maximum size of the entire transmission packet is about 1,500 bytes.

The receiver 210 in the IP-data receiving apparatus receives the transmission packet, and performs the predetermined processes such as removal of the transmission header 311. The resulting RPS packet is output to the layer separating unit 221 in the error correction decoder 220; the layer separating unit 221 refers to the field of the code length in the RPS header 312; the data portion 320 is separated into n encoded packets with different priority orders; and each of the encoded packets is output to the corresponding one of the RPS buffers 222-1 to 222-n. Each of the encoded packets stored in the RPS buffers 222-1 to 222-n is output to the RPS decoder 223; the RPS decoder 223 performs the matrix operation to the bit string of the combination information corresponding to the layer of each encoded packet; and the RPS decoder 223 reproduces the original information block from the XOR. The RPS decoder 223 further couples the information blocks, and outputs the resulting data to the buffers 224-1 to 224-n according to the priority order of the data.

The data with different priorities are combined by the combining unit 225 to be one piece of received data. The decoder 230 decodes the received data, and the display unit 240 displays the reproduced image data thereon.

As described above, the configuration according to the embodiment classifies the transmitted data based on the importance and vulnerability of the information in the data; defines the range of data in which a plurality of data can be combined in the code length corresponding to the layer; determines the number of the combination patterns corresponding to the redundancy of the layer; and performs the error correction coding based on the determined combination patterns. In this manner, the higher the priority of the information is, the farther distanced data are combined for the error correction coding, and the information in the data is dispersed into more packets. As a result, errors can be corrected even if an entire packet is lost, and thus the quality of the streaming is improved.

According to another aspect of the present invention, the range of the combined data varies depending on the layer, and also the redundancy varies depending on the layer. This is advantageous in that the error correction coding is performed to maintain the resistance to errors suitable to the priority order of the information.

According to still another aspect, the information with higher priority allows combination of data in larger range to disperse the high-priority information with higher resistance to errors.

According to still another aspect, the higher the priority of the information is, the larger the redundancy is, resulting in the improved resistance to errors.

According to still another aspect, sufficient resistance to errors is provided to multimedia data that must be transmitted in real time.

According to still another aspect, sufficient resistance to errors is provided to data that is transmitted by a vulnerable method.

According to still another aspect, additional associated information is displayed along with the image information, and the primary image information is more resistant to errors to be more correctly transmitted than the secondary associated information.

According to still another aspect, for example, an image taken by a monitoring camera includes the time at which the image was taken.

Still another aspect of the present invention improves service to customers by displaying, for example, the name or the personality profile of the object person.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An internet protocol data (IP-data) transmitting apparatus that transmits data using an internet protocol (IP), the IP-data transmitting apparatus comprising:
    a classifying unit that classifies data into a specific layer of a plurality of layers, a position of the specific layer corresponding to priority order of the data, the priority being based on importance and vulnerability of information included in the data;
    an assigning unit that allocates a specific code length to the data, based on the position of the specific layer, and divides the data into a plurality of data blocks with a specific size, the specific size corresponding to the specific code length;
    an error correction coding unit that divides the plurality of data blocks into a plurality of information blocks with a predetermined size, and performs an error correction coding by making a plurality of combinations from the plurality of information blocks; and a transmitting unit that transmits packets produced from the error correction coded data, wherein the assigning unit allocates longer code length to the data in a higher layer and shorter code length to the data in a lower layer, the number of the plurality of combinations is different with respect to the position of the specific layer, and the error correction coding unit makes more combinations of the information blocks in the higher layer and less combinations of the information blocks in the lower layer.

2. The IP-data transmitting apparatus according to claim 1, wherein the classifying unit prioritizes the data to be transmitted only one time over other data.

3. The IP-data transmitting apparatus according to claim 1, wherein the number of combinations of the information blocks in a data block is obtained by multiplying a number of the information blocks included in the data block by a value of redundancy defined for the layer of the data block.

4. The IP-data transmitting apparatus according to claim 1, wherein the error correction coding unit includes a selecting unit that selects the number of the plurality of combinations of the information blocks, wherein the number corresponds to the position of the specific layer; and a computing unit that computes an exclusive OR of the information blocks in each of the combinations.

5. The IP-data transmitting apparatus according to claim 4, wherein the error correction coding unit divides the data block in a more prioritized layer into more information blocks.

6. The IP-data transmitting apparatus according to claim 4, wherein the selecting unit selects more combinations for the data block in the specific layer having higher priority.

7. The IP-data transmitting apparatus according to claim 1, further comprising an acquiring unit that acquires associated information in association with the image information, wherein the classifying unit prioritizes the image information over the associated information.

8. The IP-data transmitting apparatus according to claim 7, wherein the acquiring unit acquires time at which the image information is taken as the associated information.

9. The IP-data transmitting apparatus according to claim 7, wherein the acquiring unit acquires information associated with an object of the image information as the associated information.

10. An internet protocol data (IP-data) transmitting apparatus comprising:

a classifying unit that classifies data into a layer indicative of priority order of the data based on importance and vulnerability of information included in the data;

an error correction coding unit that performs an error correction coding by combining a plurality of data components into combination patterns, the number of the combination patterns being specified with respect to each layer classified by the classifying unit, thereby producing error-correction coded data; and a transmitting unit that transmits packets produced from the error correction coded data, wherein the classifying unit prioritizes the data to be displayed in real time over other data.

11. A method for transmitting data using an internet protocol (IP), the method comprising:

classifying data into a specific layer of a plurality of layers, a position of the specific layer corresponding to priority order of the data, the priority being based on importance and vulnerability of information included in the data;

allocating a specific code length to the data, based on the position of the specific layer;

dividing the data into a plurality of data blocks with a specific size, the specific size corresponding to the specific code length;

dividing the plurality of data blocks into a plurality of information blocks with a predetermined size;

performing an error correction coding by making a plurality of combinations from the plurality of information blocks; and transmitting packets resulting from the error correction coded data, wherein the allocating includes allocating longer code length to the data in a higher layer and shorter code length to the data in a lower layer, the number of the plurality of combinations is different with respect to the position of the specific layer, and the performing includes making more combinations of the information blocks in the higher layer and less combinations of the information blocks in the lower layer.

* * * * *